Sept. 20, 1966 E. BELLEM 3,274,495
FREQUENCY CONVERSION CIRCUIT
Filed Nov. 7, 1962
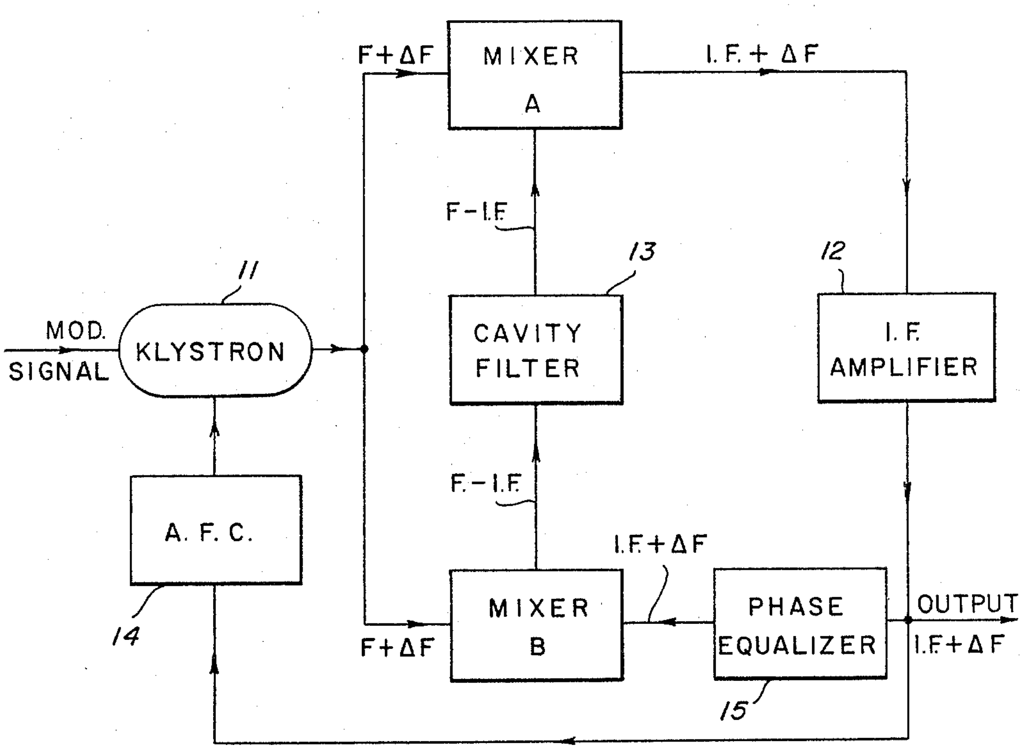
INVENTOR
EDWARD BELLEM
BY Smart & Biggar
ATTORNEYS.

United States Patent Office 3,274,495

Patented Sept. 20, 1966

3,274,495

FREQUENCY CONVERSION CIRCUIT

Edward Bellem, Ottawa, Ontario, Canada, assignor to Northern Electric Company Limited, Montreal, Quebec, Canada Filed Nov. 7, 1962, Ser. No. 235,970
11 Claims. (Cl. 325—434)

The present invention relates to a frequency conversion circuit, especially for converting the carrier frequency of frequency-modulated signals.

In present microwave equipment for the transmission of multi-channel FM signals, a high degree of modulation linearity is required. For high capacity systems including 600 or more channels, this linearity is most easily obtained from a klystron modulator. A disadvantage of the klystron modulator is that it produces modulation at microwave frequencies. However, it would be desirable for reasons of flexibility (ease of measurement, substitution of components, use of standard components, etc.) to produce a modulated signal at a lower frequency, such as the standard 70 megacycles widely used. Accordingly, devices presently known in the art utilize two klystrons which oscillate at different frequencies, and whose outputs are mixed so as to produce a difference frequency which serves as the lower frequency used to carry the output modulated signal. It would be desirable, for reasons of economy, inter alia, to use only a single klystron. Circuits are known in the art which use a single oscillator, in combination with suitable amplifiers, filters and feedback loops to produce an output signal having a frequency which is lower or higher than the input frequency. For example, frequency multipliers and dividers may operate on this principle (an example of such a frequency divider is discussed in United States Patent 2,617,036). However, such circuits are generally unsuitable for use with klystrons, or for applications in which a modulated carrier must be altered in frequency without changing the characteristics of the applied modulation.

According to the present invention, a frequency conversion circuit is provided for converting the carrier frequency of a frequency- or phase-modulated signal, which uses only a single oscillator to which the frequency or phase modulation is applied. A suitable circuit is connected to the oscillator output, converting the carrier frequency to a different frequency without the aid of another oscillator. The circuit according to the present invention comprises a filter, a pair of mixers each adapted to receive the oscillator output frequency, and an amplifier adapted to receive the output of one of these mixers and whose output is fed into the other of the mixers thereby to be mixed with the output of the oscillator. The output of the second mixer is fed into the filter and mixed with the oscillator output signal in the first mixer. It is thus seen that a regenerative feedback loop is formed between the input and output of the amplifier, through the two mixers and the filters. This loop, because of the frequency response of the filter, tends to maintain a frequency determined by the centre frequencies of the filter and the oscillator. According to a further feature of the invention, the output of the amplifier may be fed into an automatic frequency control (AFC) circuit which controls the frequency of oscillation of the oscillator.

It is thus seen that with the use of the circuit described above, greater flexibility in circuit design is obtainable—modulation is obtained at a desired fixed frequency (e.g. 70 mc./s.) to suit component requirements. The output circuit and the frequency conversion circuit, including the automatic frequency control circuit, are thus relatively independent of the oscillator frequency. If the desired output carrier frequency is lower than the oscillator frequency, the automatic frequency control circuit may be designed to operate at this lower frequency and thus will probably be simpler and cheaper than the ordinarily used AFC circuit, while improving resolution. This results in greater frequency stability because frequency variations are relatively larger with respect to the carrier frequency at this lower frequency than at the oscillator frequency. Compared with the two-oscillator conversion circuit, the circuit according to the invention, employing only a single oscillator, makes possible higher reliability and lower power consumption at lower cost. The use of one single klystron reduces the residual modulator noise due to thermal fluctuations in klystrons. As a result a 3 db lower noise level can be expected in the proposed circuit as compared with the two-klystron modulator, assuming the same noise contribution for each klystron.

The circuit will now be described with reference to the accompanying figure of the drawing, which shows a schematic block diagram of a circuit according to the present invention.

In the drawing, a klystron oscillator 11 is shown to which is fed an input frequency modulating signal from a suitable signal source (not shown), and whose output is fed into a mixer A and a mixer B respectively. The second input to mixer B is produced by a broadband intermediate-frequency (IF) amplifier 12. The output of the mixer B is fed into a cavity filter 13 which in turn feeds the mixer A with its second input. In turn the output of mixer A is fed directly into the input circuit of the intermediate-frequency amplifier. A phase equalizer 15 is preferably inserted between the intermediate-frequency amplifier 12 and the mixer B in order that the modulated components of the two signals fed into the mixer B will be in phase. Additionally, an automatic frequency control (AFC) circuit 14 may be fed by the output of the intermediate-frequency amplifier, producing an output which is applied directly to the klystron thereby to control the frequency of oscillation of the klystron.

The operation of the circuit is as follows:

The output of the intermediate frequency amplifier consists of a desired carrier frequency IF and a superimposed frequency modulation component $\Delta F$. The output of the klystron oscillator is the carrier frequency F on which is superimposed the modulation component $\Delta F$. Accordingly, when these two frequencies are mixed in the mixer B, one component will be $(F+\Delta F)-(IF+\Delta F)$. The modulation components will cancel, leaving an output frequency $(F-IF)$ to be fed into the cavity filter. Other frequencies will of course be produced by the mixer B, but if the cavity filter is tuned to resonate at the frequency $(F-IF)$, then only this frequency will be passed as a significant input to the mixer A. In the mixer A, the difference frequency between the two input frequencies $(F+\Delta F)$ and $(F-IF)$ will be $IF+\Delta F$. Other frequencies will be produced by the mixer A, but only the last-mentioned frequency will be significantly amplified by the intermediate frequency amplifier 12, because of the amplifier characteristics and the effect of the cavity filter. It is seen that both the input and the output of the intermediate frequency amplifier 12 consist of the intermediate frequency carrier plus a modulation component superimposed thereon. Thus the circuit has produced what was required—an intermediate frequency at a lower frequency than the klystron frequency and including the modulated component. If the frequency conversion circuit is instead intended to convert the oscillator frequency F to a higher frequency IF, then the filter must be turned to resonate at the frequency $IF-F$. It can easily be seen that the desired result will be obtained.

The discussion above has proceeded on the assumption that a frequency IF was available to be fed into the mixer B. One might reasonably inquire as to how the intermediate frequency is initially produced. One solution is to feed noise directly into the intermediate frequency amplifier, or (amounting to the same thing) maintaining the gain of the intermediate-frequency amplifier at a very high level so that some amplifier noise is produced. Only that noise which is of a frequency IF will cause the cavity filter to resonate at the frequency $(F-IF)$, and thus the only significant carrier frequency fed to the input of the intermediate-frequency amplifier will be the frequency IF. If the IF amplifier is of the ordinary type employed in microwave receivers and includes an automatic gain control circuit, the gain will be maximum in the absence of an input signal and will decrease as soon as the input signal is received. At maximum gain, a considerable noise output will be delivered to the mixer B. When an input is received in the input circuit of the IF amplifier, the initially low signal will be amplified at high gain by the IF amplifier until the regenerative feedback loop has developed a signal sufficient to reach a level at which the gain of the IF amplifier is reduced. As the gain is reduced, the noise output is consequently reduced and only the input IF signal is amplified. At a sufficiently high amplitude, the automatic gain control circuit maintains the IF amplifier gain at a relatively low level which is sufficient to provide stable operation, assuring a low noise, and an amplification of only the modulated IF signal. An IF amplifier having this automatic gain control feature is thus preferably used in apparatus according to the invention in order to avoid instability and noise problems.

It can be seen that, unless the two ΔF components fed into mixer B are of the same phase, unwanted phase modulation will be fed into the cavity filter and thence into the IF amplifier thus producing some phase modulation in the output of the IF amplifier. Accordingly, a phase equalizer 15 is preferably inserted between the IF amplifier 12 and the mixer B in order to ensure that the two modulated frequency components fed into the mixer B are of identical phase. This ensures that the ΔF component fed into each input of the mixer B will cancel out the other ΔF component completely. Proper impedance matching of the mixer B to the IF amplifier can also be used to avoid the unwanted phase modulation—this tends to minimize phase distortion in the mixer.

It will be noted that the modulation signal and the automatic frequency control signal both have to be applied to the klystron 11. If these signals are both applied to the repeller of the klystron, the AFC voltage must be kept within certain limits in order not to interfere with modulation linearity. This situation could be remedied by using a "thermally-tuned" klystron (e.g. Bendix model TK59) in which modulation and AFC functions can be separate from one another.

The frequencies for which the inventors designed the above circuit are as follows:

$F$=4 to 6 kmc.;
$\Delta F$=4 mc. maximum;
$IF$=70 mc.

However, the general layout of circuit components shown in the drawing might be used with suitable adjustments, at any frequency. It is not necessary that a klystron oscillator be used; any suitable oscillator might be used in place of the klystron 11. Similarly, a cavity filter need not be used for some applications, some other type of filter might be preferable. Each of the components shown in the drawing is a conventional component constructed according to known methods.

What I claim as my invention is:

1. A frequency conversion circuit for converting a first frequency-modulated signal at a first carrier frequency to a second modulated signal at a second carrier frequency, the second signal having substantially the same modulation as the first signal, comprising an oscillator adapted to oscillate at the first carrier frequency, an amplifier adapted to amplify signals at the second carrier frequency, a first mixer adapted to receive as inputs the output of the oscillator and the output of the amplifier, a band-pass filter adapted to receive the output of the first mixer and adapted to pass one of the output signals produced by the first mixer, a second mixer adapted to receive as inputs the output of the oscillator and the output of the filter, the amplifier being adapted to receive as an input the output of the second mixer and being adapted to amplify one of the signals produced by the second mixer.

2. A circuit as defined in claim 1, wherein, if the first carrier frequency is $F_1$ and the second carrier frequency is $F_2$, the centre frequency of the band-bass of the filter is $F_1-F_2$, and the amplifier is adapted to amplify maximally signals having a carrier frequency $F_2$.

3. A circuit as defined in claim 1, wherein, if the first carrier frequency is $F_1$ and the second carrier frequency is $F_2$, the centre frequency of the pass-band of the filter is $F_2-F_1$, and the amplifier is adapted to amplify maximally signals having a carrier frequency $F_2$.

4. A frequency conversion circuit comprising an oscillator adapted to oscillate at a frequency $F_1$, a first and a second mixer each adapted to receive the output of the oscillator, an amplifier adapted to receive the output of the first mixer and adapted to provide an output having a carrier frequency $F_2$ which is fed into the second mixer, and a filter tuned to resonate at a frequency which is the difference between the frequencies $F_1$ and $F_2$ and adapted to receive the output of the second mixer and adapted to produce an output which is fed as an input into the first mixer.

5. Apparatus as claimed in claim 4, wherein the oscillator output signal is frequency-modulated.

6. Apparatus as claimed in claim 5, additionally including a phase equalizer connected between the amplifier and the second mixer, thereby to maintain the modulation components of the inputs to the second mixer at the same phase.

7. Apparatus as claimed in claim 4, wherein the oscillator output signal is phase-modulated.

8. Apparatus for deriving from a first frequency modulated signal of higher frequency a second frequency modulated signal of lower frequency having the same frequency deviation as the signal of the higher frequency, comprising first mixing means adapted to mix the first signal with a signal of fixed frequency equal to the difference between the higher frequency and the lower frequency thereby to produce said second signal, means for amplifying the second signal, and second mixing means for mixing the amplified second signal with said first signal thereby to produce said fixed frequency signal.

9. Apparatus as defined in claim 8, additionally including selecting means adapted to select the fixed frequency signal from the output of the second mixing means and to pass the selected signal to the first mixing means.

10. Apparatus as defined in claim 9, additionally including means for effecting phase equalization at the second mixing means of the frequency modulation inputs.

11. Apparatus as defined in claim 9 wherein said first signal is generated in a klystron oscillator and automatic frequency control means is provided between the output of said amplifying means and the repeller of the klystron oscillator.

References Cited by the Examiner

UNITED STATES PATENTS

| | | | |
|---|---|---|---|
| 2,735,001 | 2/1956 | Witters | 325—432 |
| 2,917,713 | 12/1959 | Gravling | 325—418 |
| 3,106,681 | 10/1963 | Smith | 325—434 |
| 3,119,067 | 1/1964 | Wohlenberg et al. | 325—434 X |

KATHLEEN H. CLAFFY, *Primary Examiner.*

DAVID G. REDINBAUGH, *Examiner.*

R. F. ROTELLA, R. S. BELL, *Assistant Examiners.*